United States Patent
Park et al.

(10) Patent No.: US 9,257,384 B2
(45) Date of Patent: Feb. 9, 2016

(54) INTEGRATED CIRCUIT PACKAGING SYSTEM WITH SUBSTRATE AND METHOD OF MANUFACTURE THEREOF

(75) Inventors: Soohan Park, Sungnam-si (KR); Sung Jun Yoon, Icheon-si (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/488,812

(22) Filed: Jun. 5, 2012

(65) Prior Publication Data
US 2013/0320566 A1 Dec. 5, 2013

(51) Int. Cl.
*H01L 29/66* (2006.01)
*H01L 23/498* (2006.01)
*H01L 23/00* (2006.01)
*H01L 21/56* (2006.01)

(52) U.S. Cl.
CPC ......... *H01L 23/49833* (2013.01); *H01L 21/563* (2013.01); *H01L 23/49838* (2013.01); *H01L 24/16* (2013.01); *H01L 24/32* (2013.01); *H01L 24/81* (2013.01); *H01L 2224/131* (2013.01); *H01L 2224/16225* (2013.01); *H01L 2224/32225* (2013.01); *H01L 2224/73204* (2013.01); *H01L 2224/81444* (2013.01); *H01L 2224/81447* (2013.01); *H01L 2224/81455* (2013.01); *H01L 2224/81464* (2013.01); *H01L 2224/92* (2013.01); *H01L 2224/97* (2013.01); *H01L 2924/381* (2013.01)

(58) Field of Classification Search
CPC ................. H01L 2924/00; H01L 2224/48227; H01L 2224/73265; H01L 2224/32225; H01L 2924/00014; H01L 2924/0002; H01L 2224/48091; H01L 27/11582
USPC ........................................................ 257/777
See application file for complete search history.

(56) References Cited

U.S. PATENT DOCUMENTS

| 6,075,710 | A | * | 6/2000 | Lau ................................ 361/760 |
| 6,081,429 | A | | 6/2000 | Barrett |
| 7,504,271 | B2 | | 3/2009 | Palanduz |
| 7,911,046 | B2 | | 3/2011 | Cablao et al. |
| 2006/0202322 | A1 | | 9/2006 | Kariya et al. |
| 2010/0148370 | A1 | * | 6/2010 | Han ................................ 257/774 |
| 2011/0037157 | A1 | * | 2/2011 | Shin et al. ...................... 257/686 |
| 2011/0304057 | A1 | * | 12/2011 | Matsumoto ................... 257/774 |

* cited by examiner

*Primary Examiner* — Tony Tran
(74) *Attorney, Agent, or Firm* — Ishimaru & Associates LLP

(57) ABSTRACT

A method of manufacture of an integrated circuit packaging system includes: providing a base substrate; mounting a stack substrate over the base substrate with an inter-substrate connector directly on the stack substrate and the base substrate, the inter-substrate connector having an inter-substrate connector pitch; mounting an integrated circuit over the stack substrate, the integrated circuit having an internal connector directly on the stack substrate; and attaching an external connector directly on the base substrate, the external connector having an external connector pitch greater than the inter-substrate connector pitch.

8 Claims, 6 Drawing Sheets

INTEGRATED CIRCUIT PACKAGING SYSTEM WITH SUBSTRATE AND METHOD OF MANUFACTURE THEREOF

TECHNICAL FIELD

The present invention relates generally to an integrated circuit packaging system, and more particularly to a system for an integrated circuit packaging system with substrate.

BACKGROUND ART

Greater packaging density of integrated circuits ("ICs"), higher performance, and lower cost are ongoing goals of the computer industry. Semiconductor package structures continue to advance toward increasing density of components that are packaged therein. This is in response to continually increasing demands on information and communication products for ever-reduced sizes, thicknesses, and costs, along with ever-increasing performance.

These increasing requirements for density are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability.

Consumer electronics requirements demand more integrated circuits in an integrated circuit package for the increased integrated circuits content. Some technologies primarily focus on integrating more functions into each integrated circuit. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; mounting a stack substrate over the base substrate with an inter-substrate connector directly on the stack substrate and the base substrate, the inter-substrate connector having an inter-substrate connector pitch; mounting an integrated circuit over the stack substrate, the integrated circuit having an internal connector directly on the stack substrate; and attaching an external connector directly on the base substrate, the external connector having an external connector pitch greater than the inter-substrate connector pitch.

The present invention provides an integrated circuit packaging system, including: a base substrate; a stack substrate over the base substrate; an inter-substrate connector directly on the stack substrate and the base substrate, the inter-substrate connector having an inter-substrate connector pitch; an integrated circuit over the stack substrate, the integrated circuit having an internal connector directly on the stack substrate; and an external connector directly on the base substrate, the external connector having an external connector pitch greater than the inter-substrate connector pitch.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
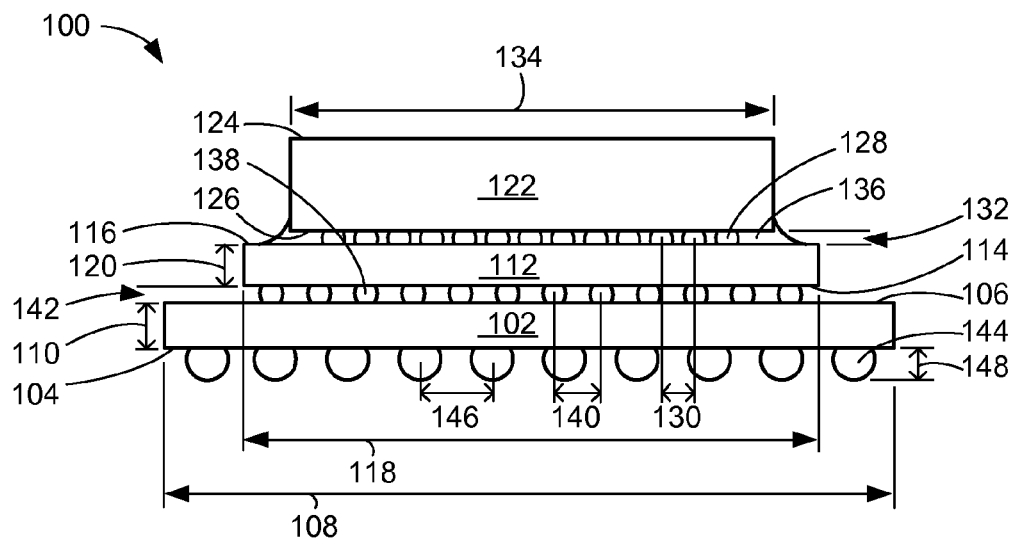
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

Figure 2:
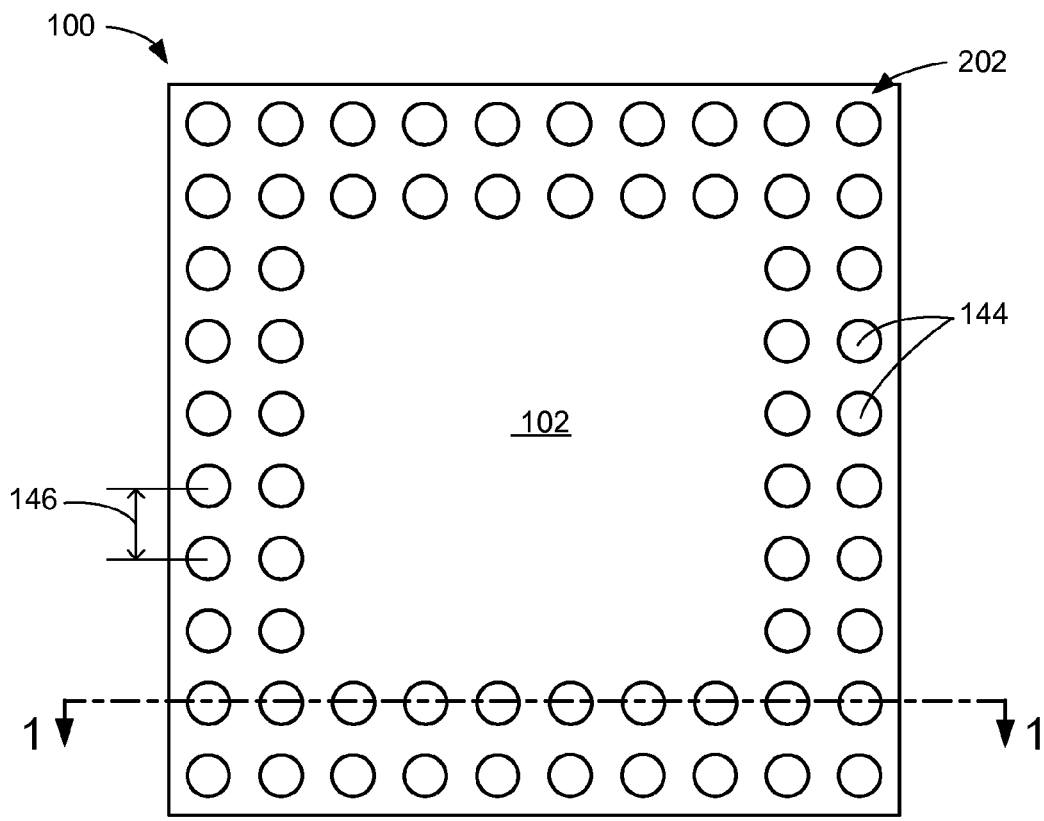
FIG. 2 is a bottom view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can represent a stack package design using separate substrates with a buildup substrate on a laminate substrate.

The integrated circuit packaging system 100 can include a base substrate 102, which is defined as a multi-layer support structure for mounting and connecting another support structure thereto including providing electrical connections through the support structure. The base substrate 102 can include a base substrate bottom side 104 and a base substrate top side 106 opposite the base substrate bottom side 104. For example, the base substrate 102 can represent a support structure including a laminate substrate or a ceramic substrate.

The base substrate 102 can include a base substrate width 108 and a base substrate height 110. The base substrate width 108 is defined as a horizontal distance from a non-horizontal end of the base substrate 102 to an opposing non-horizontal end of the base substrate 102. The base substrate height 110 is defined as a vertical distance from a non-vertical end of the base substrate 102 to an opposing non-vertical end of the base substrate 102.

The integrated circuit packaging system 100 can include a stack substrate 112, which is defined as a multi-layer support structure for mounting and connecting a semiconductor device thereto including providing electrical connections through the support structure. The stack substrate 112 can include a stack substrate bottom side 114 and a stack substrate top side 116 opposite the stack substrate bottom side 114. The stack substrate 112 redistributes electrical signals between the stack substrate bottom side 114 and the stack substrate top side 116.

For example, the stack substrate 112 can represent a support structure including a buildup substrate, which can be different from the laminate substrate. As a specific example, the stack substrate 112 can represent a buildup substrate having a 1-2-1 structure with a conductive layer on each side of a core layer with two conductive layers.

The stack substrate 112 can include a structure, having an insulation layer formed directly on a conductive layer, directly on another of the structure. However, the laminate substrate can include a structure, having multiple conductive layers formed directly on opposing sides of an insulation layer, attached to another of the structure with an adhesive layer.

The stack substrate 112 can include an epoxy resin, such as bismaleimide-triazine (BT) and fiberglass reinforced epoxy. The stack substrate 112 can include a number of insulation layers (not shown) and a number of electrically conductive layers (not shown). One of the insulation layers can be formed directly on one of the electrically conductive layers to provide electrical isolation between the electrically conductive layers that are stacked or formed over each other. Another of the electrically conductive layers can be formed directly on the one of the insulation layers to provide an additional routing layer.

The stack substrate 112 can include a stack substrate width 118 and a stack substrate height 120. The stack substrate width 118 is defined as a horizontal distance from a non-horizontal end of the stack substrate 112 to an opposing non-horizontal end of the stack substrate 112. The stack substrate height 120 is defined as a vertical distance from a non-vertical end of the stack substrate 112 to an opposing non-vertical end of the stack substrate 112.

The integrated circuit packaging system 100 can include an integrated circuit 122, which is defined as the semiconductor device having a number of integrated transistors interconnected to form active circuits. For example, the integrated circuit 122 can represent a semiconductor device including a flip-chip or a wafer scale chip.

The integrated circuit 122 can include an inactive side 124 and an active side 126. The active side 126 is defined as a side of the integrated circuit 122 having active circuitry fabricated thereon or having elements for connection to the active circuitry within the integrated circuit 122. The integrated circuit 122 can be mounted over the stack substrate 112 with the active side 126 facing the stack substrate top side 116.

The integrated circuit 122 can include internal connectors 128, which are defined as electrically conductive structures. As examples, the internal connectors 128 can be solder bumps, conductive bumps, or conductive posts or columns. The internal connectors 128 can be attached to and directly on the stack substrate top side 116 and the active side 126.

The internal connectors 128 can include an internal connector pitch 130, which is defined as a distance from a geometric center of one of the internal connectors 128 to a geometric center of another of the internal connectors 128 that is closest to the one of the internal connectors 128. The internal connector pitch 130 can be the same among the internal connectors 128. Each of the internal connectors 128 can include an internal connector height 132, which is defined as a vertical distance extending between non-vertical extents of each of the internal connectors 128.

The integrated circuit 122 can include an integrated circuit width 134, which is defined as a horizontal distance from a non-horizontal end of the integrated circuit 122 to an opposing non-horizontal end of the integrated circuit 122.

The integrated circuit packaging system 100 can include an underfill 136 attached to the integrated circuit 122 and the stack substrate 112. The underfill 136 covers the internal connectors 128 providing protection to the internal connectors 128. The underfill 136 can be attached to the active side 126 and the stack substrate top side 116.

The stack substrate top side 116 can include an area for attaching the underfill 136 to the integrated circuit 122. The stack substrate width 118 can be approximately equal to the integrated circuit width 134 or a horizontal length of the underfill 136 such that the stack substrate top side 116 provides a predetermined surface area that is sufficient for the underfill 136 to be attached to the stack substrate 112 and the integrated circuit 122.

The integrated circuit packaging system 100 can include inter-substrate connectors 138, which are defined as electrically conductive structures. As examples, the inter-substrate connectors 138 can be solder bumps, conductive bumps, or conductive posts or columns. The stack substrate 112 can be mounted over the base substrate 102 with the inter-substrate connectors 138 attached to or directly on the base substrate top side 106 and the stack substrate bottom side 114.

The inter-substrate connectors 138 can include an inter-substrate connector pitch 140, which is defined as a distance from a geometric center of one of the inter-substrate connectors 138 to a geometric center of another of the inter-substrate connectors 138 that is closest to the one of the inter-substrate connectors 138. The inter-substrate connector pitch 140 can be the same among the inter-substrate connectors 138. Each of the inter-substrate connectors 138 can include an inter-substrate connector height 142, which is defined as a vertical distance extending between non-vertical extents of each of the inter-substrate connectors 138.

The integrated circuit packaging system 100 can include external connectors 144, which are defined as electrically conductive structures. As examples, the external connectors 144 can be solder bumps, conductive bumps, or conductive posts or columns. The external connectors 144 provide electrical connectivity between the base substrate 102 and an external system (not shown). The external connectors 144 can be attached to and directly on the base substrate bottom side 104.

The base substrate 102 can provide a redistribution structure for transmission of signals from the inter-substrate connectors 138 to the external connectors 144. The base substrate width 108 can be reduced since the base substrate 102 can include only a routing structure for redistributing the signals between the inter-substrate connectors 138 and the external connectors 144.

The external connectors 144 can include an external connector pitch 146, which is defined as a distance from a geometric center of one of the external connectors 144 to a geometric center of another of the external connectors 144 that is closest to the one of the external connectors 144. The external connector pitch 146 can be the same among the external connectors 144. Each of the external connectors 144 can include an external connector height 148, which is defined as a vertical distance extending between non-vertical extents of each of the external connectors 144.

The external connector height 148 can be greater than the inter-substrate connector height 142 and the internal connector height 132. The inter-substrate connector height 142 can be greater than the internal connector height 132.

The integrated circuit width 134 can be less than the stack substrate width 118 and the base substrate width 108. The stack substrate width 118 can be less than the base substrate width 108.

The external connector pitch 146 can be greater than the inter-substrate connector pitch 140 and the internal connector pitch 130. The inter-substrate connector pitch 140 can be greater than the internal connector pitch 130.

For example, the external connector pitch 146 can include an approximate range of 0.40 millimeters (mm) to 1.50 millimeters (mm). Also for example, the inter-substrate connector pitch 140 can include an approximate range of 0.20 millimeters (mm) to 0.40 millimeters (mm). Further for example, the internal connector pitch 130 can include an approximate range of 0.080 millimeters (mm) to 0.20 millimeters (mm).

The external connector height 148 can be greater than the inter-substrate connector height 142 and the internal connector height 132. The inter-substrate connector height 142 can be greater than the internal connector height 132.

For example, the external connector height 148 can include an approximate range of 0.18 millimeters (mm) to 0.60 millimeters (mm). Also for example, the inter-substrate connector height 142 can include an approximate range of 0.11 millimeters (mm) to 0.18 millimeters (mm). Further for example, the internal connector height 132 can include an approximate range of 0.050 millimeters (mm) to 0.100 millimeters (mm).

The base substrate 102 and the stack substrate 112 provided as separate substrates can provide an alternative substrate redesign only in cases where there are die level problems with the integrated circuit 122. The redesign of only the stack substrate 112 instead of a single buildup substrate package structure reduces development cycle time and cost. For example, if a conventional flip-chip Ball Grid Array (fcBGA) package body of the single buildup substrate package structure is 35 millimeters (mm)×35 millimeters (mm), the stack substrate 112 and the base substrate 102 can be reduced to approximately 15 mm×15 mm and approximately 18 mm×18 mm, respectively.

The base substrate 102 and the stack substrate 112 can also provide reduction in production cost compared to the single buildup substrate package structure with fine or reduced trace width and space. The single buildup substrate package structure has high cost issues in production.

A signal routing path from the internal connectors 128 to the external connectors 144 can be shorter than a signal routing path through a conventional buildup type package with the single buildup substrate package structure. The signal routing path from the internal connectors 128 to the external connectors 144 can be routed through the stack substrate 112, the inter-substrate connectors 138, and the base substrate 102.

Designs of the base substrate 102 and the stack substrate 112 compensate for any signal integrity issues by optimizations with shield ground, length matching, as examples. Electrical simulation for the designs can be performed to verify predetermined conditions to minimize noise or any signal integrity issues.

It has been discovered that the base substrate 102 and the stack substrate 112 provided as separate substrates instead of the single buildup substrate package structure provide improved electrical performance since the propagation delay between the integrated circuit 122 and the external connectors 144 is reduced due to reduced routing path compared to conventional package structures with the single buildup substrate package structure.

It has also been discovered that the base substrate 102 and the stack substrate 112 provide improved signal integrity. The improved signal integrity is provided by the base substrate 102 and the stack substrate 112 having shield ground with ground planes below and above signal traces or with ground traces routed on both sides of signal traces in the same routing layer. The improved signal integrity is also provided by using length matching for a pair of signal traces that are used for differential signals.

It has further been discovered that the stack substrate 112 stacked over the base substrate 102 provides package size reduction or shrinkage compared to a general buildup type package, which is longer in length compared to the stack substrate 112. The package size reduction provides a smaller package body in the horizontal dimension as well as improved market competitiveness.

It has further been discovered that the external connector pitch 146 and the inter-substrate connector pitch 140 provide improved reliability with the external connector pitch 146 greater than the inter-substrate connector pitch 140 and the inter-substrate connector pitch 140 greater than the internal connector pitch 130. The improved reliability is provided by improved signal integrity since the external connector pitch 146 provides increased spacing to eliminate crosstalk between adjacent single-ended high-speed signals and the inter-substrate connector pitch 140 provides reduced spacing to eliminate noise for high-speed differential signals.

It has further been discovered that the external connector height 148 and the inter-substrate connector height 142 provide improved reliability with the external connector height 148 greater than the inter-substrate connector height 142 and the inter-substrate connector height 142 greater than the internal connector height 132. The improved reliability is provided since increase of the external connector height 148 and the inter-substrate connector height 142 provide increase in diameters of the external connectors 144 and the inter-substrate connectors 138, respectively, thereby providing improved solder-joint reliability.

It has further been discovered that the integrated circuit width 134, the stack substrate width 118, and the base substrate width 108 provide reduced package body size with the integrated circuit width 134 less than the stack substrate width 118 and the stack substrate width 118 less than the base substrate width 108.

It has further been discovered that the external connectors 144 directly on the base substrate 102, the inter-substrate connectors 138 directly on the stack substrate 112 and the base substrate 102, and the internal connectors 128 directly on the stack substrate 112 provide reduced package height profile.

It has further been discovered that the base substrate 102 and the stack substrate 112 provide reduced overall substrate cost and improved development schedule. When a substrate redesign is needed due to board level problems with a printed circuit board (PCB) over which the base substrate 102 is mounted, only the base substrate 102 is redesigned. When a substrate redesign is needed due to die functional problems with the integrated circuit 122, only the stack substrate 112 is redesigned. Redesign of only the base substrate 102 or only the stack substrate 112 but not both the base substrate 102 and the stack substrate 112 provide reduced overall substrate cost as well as improved development schedule.

Referring now to FIG. 2, therein is shown a bottom view of the integrated circuit packaging system 100. The bottom view depicts the external connectors 144 in a peripheral array 202, which is defined as an arrangement of a number of rows of the external connectors 144 along a perimeter of the base substrate 102. The external connectors 144 can be separate from each other based on the external connector pitch 146.

For illustrative purposes, the external connectors 144 are shown in the peripheral array 202, although it is understood that the external connectors 144 can be formed in any configuration. For example, the external connectors 144 can be formed in a full array with rows of the external connectors 144 along the perimeter of the base substrate 102 and a central portion of the base substrate 102.

Figure 3:
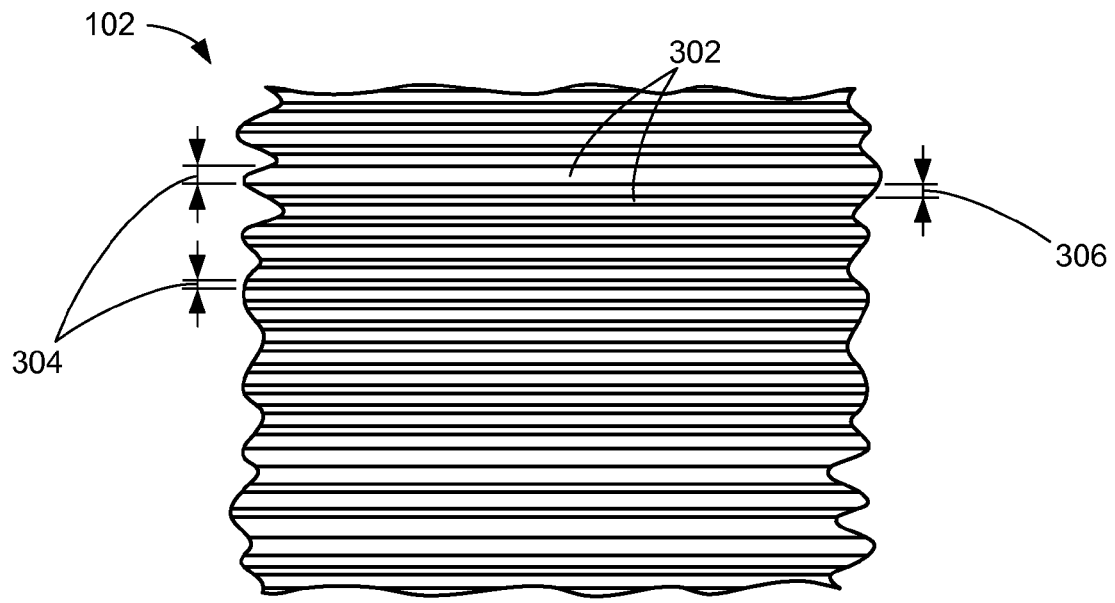
FIG. 3 is an exemplary layout view of a portion of the base substrate.

Referring now to FIG. 3, therein is shown an exemplary layout view of a portion of the base substrate 102. The exemplary layout view can represent a portion of a patterned conductive layer at the bottom, top, or within the base substrate 102. The base substrate 102 can include base traces 302, which are defined as electrically conductive connectors for transmission of electrical signals. The exemplary layout view depicts portions of the base traces 302.

The base traces 302 can include base widths 304, which are defined as distances between opposing sides of the base traces 302 and measured in a direction that is perpendicular to the opposing sides. The base widths 304 can vary based on functionality of the base traces 302. For example, the base widths 304 for the base traces 302 for supplying power or ground can be greater than the base widths 304 for the base traces 302 for transmission of data or control signals. As an example, the base widths 304 can be greater than 20 micrometers (um). As a specific example, a minimum value of the base widths 304 can be 0.025 millimeters (mm) or 25 micrometers (um).

The base traces 302 can be separate or away from each other at a base spacing 306, which is defined as a distance between sides of the base traces 302 where the sides are closest and facing each other. As an example, the base spacing 306 can be greater than 20 micrometers (um). As a specific example, a minimum value of the base spacing 306 can be 0.025 millimeters (mm) or 25 micrometers (um).

It has been discovered that the base traces 302 having the base widths 304 and the base spacing 306 provide improved reliability since the base widths 304 and the base spacing 306 greater than 20 um provide reduction of effect of crosstalk coupling among the base traces 302 that are nearby each other due to increased trace separation.

Figure 4:
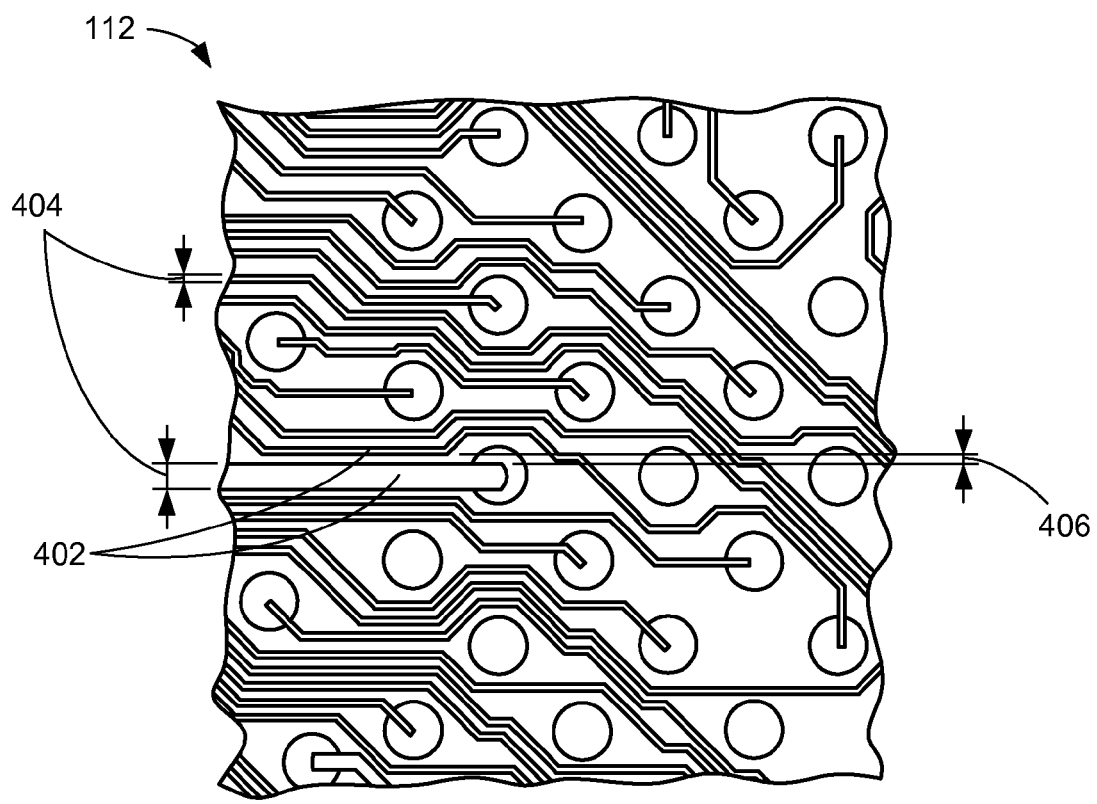
FIG. 4 is an exemplary layout view of a portion of the stack substrate.

Referring now to FIG. 4, therein is shown an exemplary layout view of a portion of the stack substrate 112. The exemplary layout view can represent a portion of a patterned conductive layer at the bottom, top, or within the stack substrate 112.

The stack substrate 112 can include stack traces 402, which are defined as electrically conductive connectors for transmission of electrical signals. The exemplary layout view depicts portions of the stack traces 402. For example, the stack substrate 112 can represent a buildup substrate with a bump area for attaching the internal connectors 128 of FIG. 1 or the inter-substrate connectors 138 of FIG. 1.

The stack traces 402 can include stack widths 404, which are defined as distances between opposing sides of the stack traces 402 and measured in a direction that is perpendicular to the opposing sides. The stack widths 404 can vary based on functionality of the stack traces 402. For example, the stack widths 404 for the stack traces 402 for supplying power or ground can be greater than the stack widths 404 for the stack traces 402 for transmission of data or control signals. Also for example, the stack widths 404 can be less than 20 micrometers (um).

The stack traces 402 can be separate or away from each other at a stack spacing 406, which is defined as a distance between sides of the stack traces 402 where the sides are closest and facing each other. For example, the stack spacing 406 can be less than 20 micrometers (um). The stack widths 404 less than 20 um and the stack spacing 406 less than 20 um can provide fine trace and spacing for fine bump pitch design.

For example, a minimum value for the stack widths 404 can be 0.010 millimeters (mm). Also for example, a minimum value for the stack spacing 406 can be 0.010 millimeters (mm). Further for example, a minimum value for the stack widths 404 or the stack spacing 406 can be determined based on substrate supplier capability.

It has been discovered that the stack traces 402 having the stack widths 404 and the stack spacing 406 provide improved reliability since the stack widths 404 less than 20 um and the stack spacing 406 less than 20 um provide reduced spacing thereby eliminating noise for high-speed differential signals.

Figure 5:
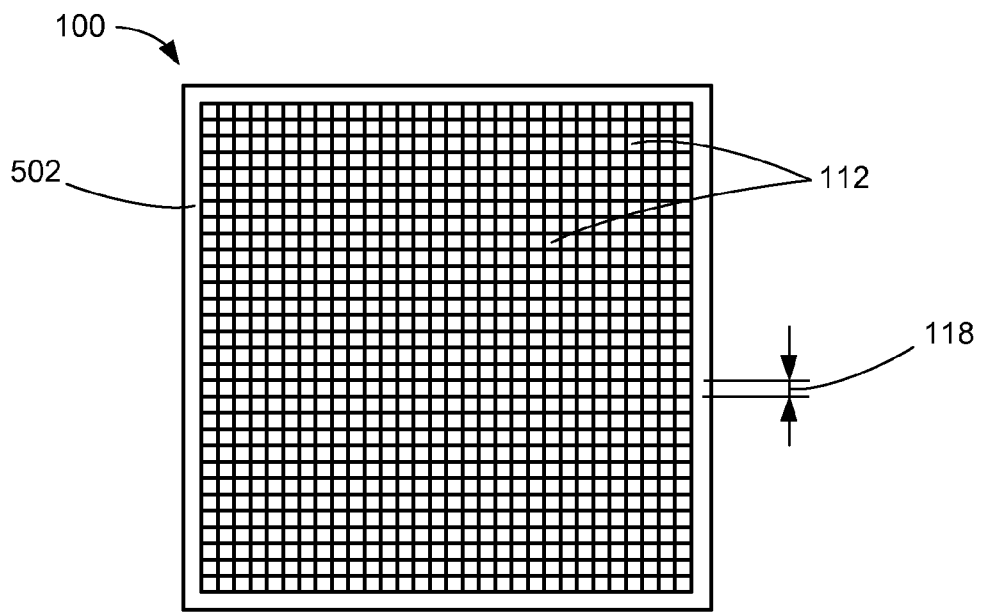
FIG. 5 is a top view of a first panel of the integrated circuit packaging system in a first substrate-providing phase of manufacture.

Referring now to FIG. 5, therein is shown a top view of a first panel 502 of the integrated circuit packaging system 100 in a first substrate-providing phase of manufacture. An array of a number of the stack substrate 112 can be provided together in the first panel 502. For example, the first panel 502 can represent a panel of a unit type or a flip-chip Ball Grid Array (fcBGA) type. Also for example, the stack substrate 112 can represent a support structure for mounting an fcBGA.

For example, each square shown in the top view can represent the stack substrate 112. Also for example, the first panel 502 can include the array of multiple instances of the stack substrate 112.

For illustrative purposes, the stack substrate 112 is shown as a square in the first panel 502, although it is understood that the stack substrate 112 can include any shape. For example, the stack substrate 112 can have a rectangular shape. Also for example, the first panel 502 can include 900 units of the stack substrate 112.

It has been discovered that the first panel 502 having a number of the stack substrate 112 provides improved panel utilization due to increase in number of the stack substrate 112 in the first panel 502 since the stack substrate width 118 is reduced compared to a general buildup substrate. The improved panel utilization provides low cost contribution in mass production.

Figure 6:
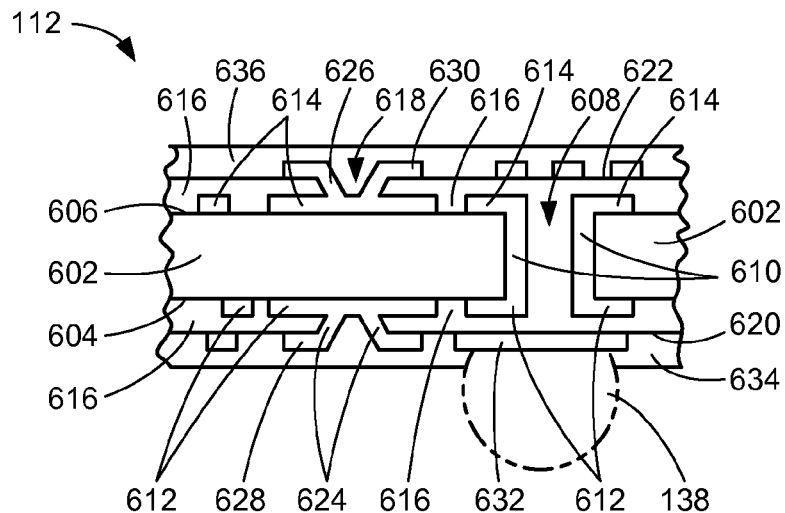
FIG. 6 is a more detailed cross-sectional view of a portion of the stack substrate.

Referring now to FIG. 6, therein is shown a more detailed cross-sectional view of a portion of the stack substrate 112. The stack substrate 112 can be provided by the first panel 502 of FIG. 5.

The stack substrate 112 can include a stack core layer 602. The stack core layer 602 can include an insulating material including a glass fiber base material, a synthetic fiber base material, a paper base material, and any other core material. As a specific example, the stack core layer 602 can include a glass woven cloth, a glass non-woven cloth, polyamide-based resin fibers, polyester-based resin fibers, polyimide resin fibers, fluorocarbon resin fibers, cotton linter paper, or a combination thereof.

The stack core layer 602 can include a stack core bottom side 604 and a stack core top side 606. The stack core layer 602 can include a stack hole 608 through the stack core layer 602 from the stack core bottom side 604 to the stack core top side 606.

The stack substrate 112 can include a stack connector 610 within the stack hole 608 and directly on a sidewall of the stack core layer 602. The sidewall horizontally bounds the stack hole 608. The stack connector 610 provides electrical connectivity between the stack core bottom side 604 to the stack core top side 606.

The stack substrate 112 can include first stack conductive layers, such as a first stack bottom conductive layer 612 and a first stack top conductive layer 614. The first stack bottom conductive layer 612 and the first stack top conductive layer 614 are defined as electrically conductive structures. The first stack bottom conductive layer 612 and the first stack top conductive layer 614 can be formed with an electrically conductive material including copper (Cu), a metal, or any other conductive material. As a specific example, the first stack bottom conductive layer 612 and the first stack top conductive layer 614 can be formed with copper foils.

The first stack bottom conductive layer 612 and the first stack top conductive layer 614 can be directly on the stack core bottom side 604 and the stack core top side 606, respectively. The first stack bottom conductive layer 612 and the first stack top conductive layer 614 can be directly on a bottom side of the stack connector 610 and a top side of the stack connector 610, respectively. The stack connector 610 provides electrical connectivity between the first stack bottom conductive layer 612 and the first stack top conductive layer 614. For example, the first stack bottom conductive layer 612 and the first stack top conductive layer 614 can be patterned to provide a number of conductive traces for routing electrical signals.

The stack substrate 112 can include a stack insulation 616, which is defined as an electrically insulation structure. The stack insulation 616 can be formed with an insulating material including a dielectric, epoxy resin, or glass epoxy. For example, the stack insulation 616 can include a prepreg material. As a specific example, the stack insulation 616 can include polytetrafluoroethylene (or Teflon), glass-reinforced epoxy, phenolic cotton paper, woven glass, matte glass, polyester, non-woven glass, or a combination thereof.

The stack insulation 616 can be directly on the stack connector 610 within the stack hole 608. The stack insulation 616 can be directly on the first stack bottom conductive layer 612, the first stack top conductive layer 614, and portions of the stack core layer 602 at the stack core bottom side 604 and the stack core top side 606.

The stack insulation 616 can include stack insulation holes 618 through portions of the stack insulation 616 that are over the first stack bottom conductive layer 612 and the first stack top conductive layer 614. The stack insulation holes 618 can expose portions of the first stack bottom conductive layer 612 and the first stack top conductive layer 614 from the stack insulation 616. The stack insulation holes 618 can be formed at a stack insulation bottom side 620 of the stack insulation 616 and a stack insulation top side 622 of the stack insulation 616.

The stack substrate 112 can include stack inter-layer connectors, such as a stack bottom inter-layer connector 624 and a stack top inter-layer connector 626 within the stack insulation holes 618. The stack bottom inter-layer connector 624 and the stack top inter-layer connector 626 can be directly on sidewalls of the stack insulation 616. The sidewalls horizontally bound the stack insulation holes 618.

The stack substrate 112 can include second stack conductive layers, such as a second stack bottom conductive layer 628 and a second stack top conductive layer 630. The second stack bottom conductive layer 628 and the second stack top conductive layer 630 are defined as electrically conductive structures. The second stack bottom conductive layer 628 and the second stack top conductive layer 630 can be formed with an electrically conductive material including copper (Cu), a metal, or any other conductive material. The stack bottom inter-layer connector 624 can directly connect the first stack bottom conductive layer 612 and the second stack bottom conductive layer 628. The stack top inter-layer connector 626 can directly connect the first stack top conductive layer 614 and the second stack top conductive layer 630. As a specific example, the second stack bottom conductive layer 628 and the second stack top conductive layer 630 can be formed with copper foils.

The second stack bottom conductive layer 628 and the second stack top conductive layer 630 can be directly on the stack insulation bottom side 620 and the stack insulation top side 622, respectively. The second stack bottom conductive layer 628 and the second stack top conductive layer 630 can be directly on the stack bottom inter-layer connector 624 and the stack top inter-layer connector 626, respectively. For example, the second stack bottom conductive layer 628 and the second stack top conductive layer 630 can be patterned to provide a number of conductive traces for routing electrical signals.

The stack bottom inter-layer connector 624 provides electrical connectivity between the first stack bottom conductive layer 612 and the second stack bottom conductive layer 628. The stack top inter-layer connector 626 provides electrical connectivity between the first stack top conductive layer 614 and the second stack top conductive layer 630.

The stack substrate 112 can include a stack bottom pad 632 to provide an attachment site for attaching one of the inter-substrate connectors 138. One of the inter-substrate connectors 138 is shown with a dash line since the inter-substrate connectors 138 are to be attached in a subsequent phase of manufacture.

The stack substrate 112 can also include stack pads, such as a stack top pad (not shown) to provide an attachment site for attaching one of the internal connectors 128 of FIG. 1. For example, the stack bottom pad 632, the stack top pad, the second stack bottom conductive layer 628, and the second stack top conductive layer 630 can be plated with an electrically conductive material including copper (Cu), nickel (Ni), palladium (Pd), gold (Au), or any combination thereof The stack substrate 112 can include stack protection layers, such as a stack bottom protection layer 634 and a stack top protection layer 636, which are defined as electrical insulation structures. The stack bottom protection layer 634 can be directly on the stack bottom inter-layer connector 624 within one of the stack insulation holes 618, the second stack bottom conductive layer 628, and a portion of the stack bottom pad 632. The stack top protection layer 636 can be directly on the stack top inter-layer connector 626 within one of the stack insulation holes 618, and the second stack top conductive layer 630. For example, the stack bottom protection layer 634 and the stack top protection layer 636 can be formed with an insulation material including solder resist or epoxy.

Figure 7:
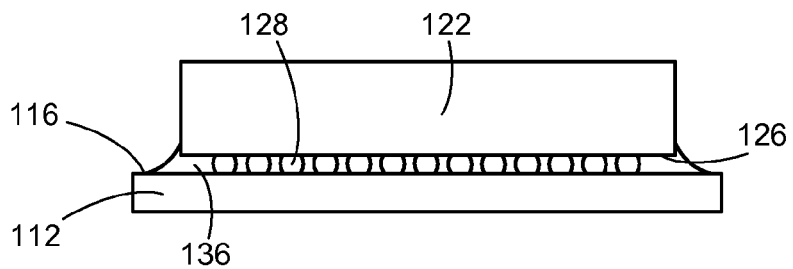
FIG. 7 is a cross-sectional view of a portion of the integrated circuit packaging system of FIG. 1 in an underfill-formation phase of a manufacturing process.

Referring now to FIG. 7, therein is shown a cross-sectional view of a portion of the integrated circuit packaging system 100 of FIG. 1 in an underfill-formation phase of a manufacturing process. The integrated circuit 122 can be mounted over the stack substrate top side 116 of the stack substrate 112. The internal connectors 128 can be attached to the stack substrate top side 116 and the active side 126 of the integrated circuit 122. The internal connectors 128 can be covered by the underfill 136.

Figure 8:
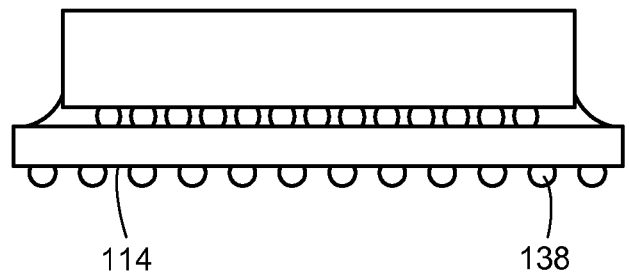
FIG. 8 is the structure of FIG. 7 in a first connector-attachment phase.

Referring now to FIG. 8, therein is shown the structure of FIG. 7 in a first connector-attachment phase. The inter-substrate connectors 138 can be attached at the stack substrate bottom side 114. The inter-substrate connectors 138 can be attached to the stack bottom pad 632 of FIG. 6.

Figure 9:
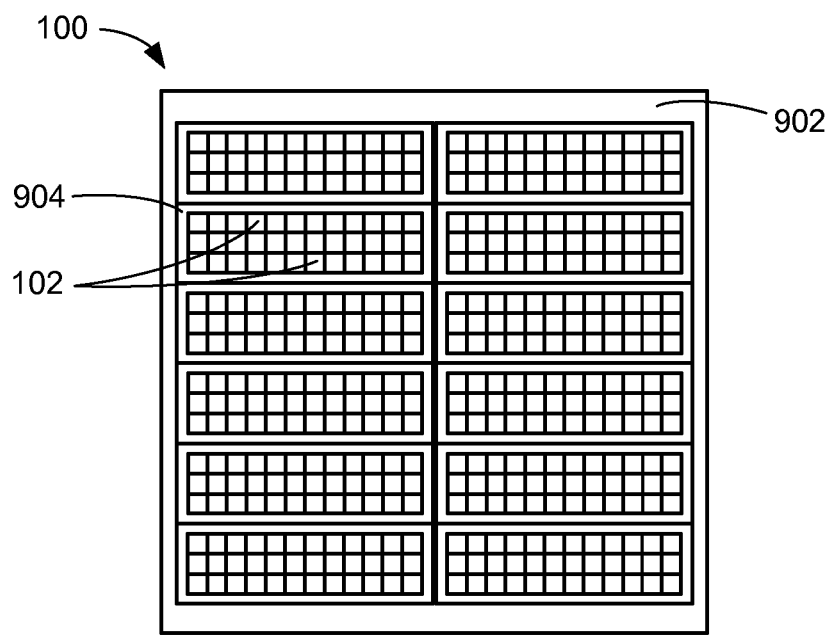
FIG. 9 is a top view of a second panel of the integrated circuit packaging system in a second substrate-providing phase.

Referring now to FIG. 9, therein is shown a top view of a second panel 902 of the integrated circuit packaging system 100 in a second substrate-providing phase. An array of a number of the base substrate 102 can be provided together in a strip 904 of the second panel 902. The second panel 902 can include a number of the strip 904.

For example, each square shown in the top view can represent the base substrate 102. Also for example, the second panel 902 can include a number of the strip 904. The strip 904 can include multiple of the base substrate 102.

The strip 904 can include an array of multiple instances of the base substrate 102. For example, the second panel 902 can include 432 units of the base substrate 102 compared to a panel of 169 units of a panel for the single buildup substrate package structure.

For illustrative purposes, the base substrate 102 is shown as a square in the second panel 902, although it is understood that the base substrate 102 can include any shape. For example, the base substrate 102 can have a rectangular shape.

It has been discovered that the second panel 902 having a number of the strip 904 provides better cost advantage by high panel utilization resulting in a low cost package.

Figure 10A:
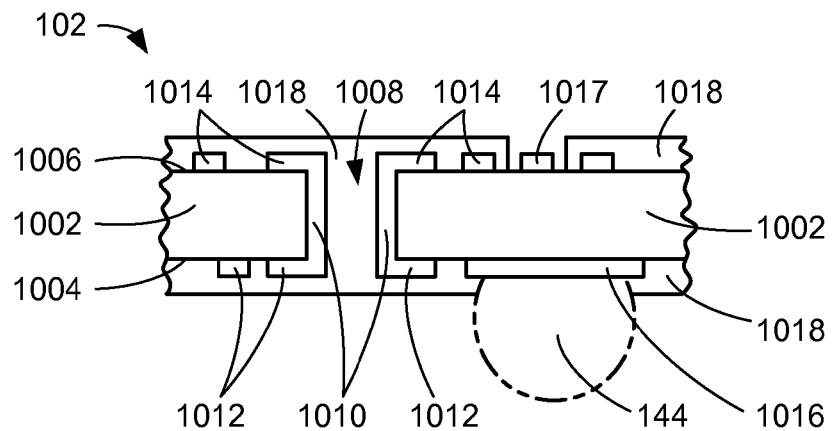
FIG. 10(A) is a first exemplary detailed cross-sectional view of a portion of the base substrate.

Referring now to FIG. 10(A), therein is shown a first exemplary detailed cross-sectional view of a portion of the base substrate 102. The base substrate 102 can be provided by the strip 904 of FIG. 9. For example, the base substrate 102 can represent a two-layer (2L) substrate with plated through holes (PTH).

The base substrate 102 can include a base core layer 1002. The base core layer 1002 can include an insulating material including a glass fiber base material, a synthetic fiber base material, a paper base material, and any other core material. As a specific example, the base core layer 1002 can include a glass woven cloth, a glass non-woven cloth, polyamide-based resin fibers, polyester-based resin fibers, polyimide resin fibers, fluorocarbon resin fibers, cotton linter paper, or a combination thereof.

The base core layer 1002 can include a base core bottom side 1004 and a base core top side 1006. The base core layer 1002 can include a base hole 1008 through the base core layer 1002 from the base core bottom side 1004 to the base core top side 1006.

The base substrate 102 can include a base connector 1010 within the base hole 1008 and directly on a sidewall of the base core layer 1002. The sidewall horizontally bounds the base hole 1008. The base connector 1010 provides electrical connectivity between the base core bottom side 1004 to the base core top side 1006.

The base substrate 102 can include a base bottom conductive layer 1012 and a base top conductive layer 1014. The base bottom conductive layer 1012 and the base top conductive layer 1014 are defined as electrically conductive structures. The base bottom conductive layer 1012 and the base top conductive layer 1014 can be formed with an electrically conductive material including copper (Cu), a metal, or any other conductive material. As a specific example, the base bottom conductive layer 1012 and the base top conductive layer 1014 can be formed with copper foils.

The base bottom conductive layer 1012 and the base top conductive layer 1014 can be directly on the base core bottom side 1004 and the base core top side 1006, respectively. The base bottom conductive layer 1012 and the base top conductive layer 1014 can be directly on a bottom side of the base connector 1010 and a top side of the base connector 1010, respectively. The base connector 1010 provides electrical connectivity between the base bottom conductive layer 1012 and the base top conductive layer 1014. For example, the base bottom conductive layer 1012 and the base top conductive layer 1014 can be patterned to provide a number of conductive traces for routing electrical signals.

The base substrate 102 can include a base bottom pad 1016 to provide an attachment site for attaching one of the external connectors 144. One of the external connectors 144 is shown with a dash line since the external connectors 144 are to be attached in a subsequent phase of manufacture.

The base substrate 102 can also include a base top pad 1017 to provide an attachment site for attaching one of the inter-substrate connectors 138 of FIG. 1. For example, the base bottom pad 1016, the base top pad 1017, the base bottom conductive layer 1012, and the base top conductive layer 1014 can be plated with an electrically conductive material including copper (Cu), nickel (Ni), palladium (Pd), gold (Au), or any combination thereof.

The base substrate 102 can include a base insulation 1018, which is defined as an electrically insulation structure. The base insulation 1018 can be formed with an insulating material including solder resist or epoxy.

The base insulation 1018 can be directly on the base connector 1010 within the base hole 1008. The base insulation 1018 can be directly on the base bottom conductive layer 1012, the base top conductive layer 1014, and portions of the base core layer 1002 at the base core bottom side 1004 and the base core top side 1006. The base insulation 1018 can be directly on a portion of the base bottom pad 1016.

The base bottom pad 1016 can be partially exposed from the base insulation 1018. The base top pad 1017 can be exposed from the base insulation 1018. A portion of the base core layer 1002 at the base core top side 1006 and surrounding the base top pad 1017 can be exposed from the base insulation 1018.

Figure 10B:
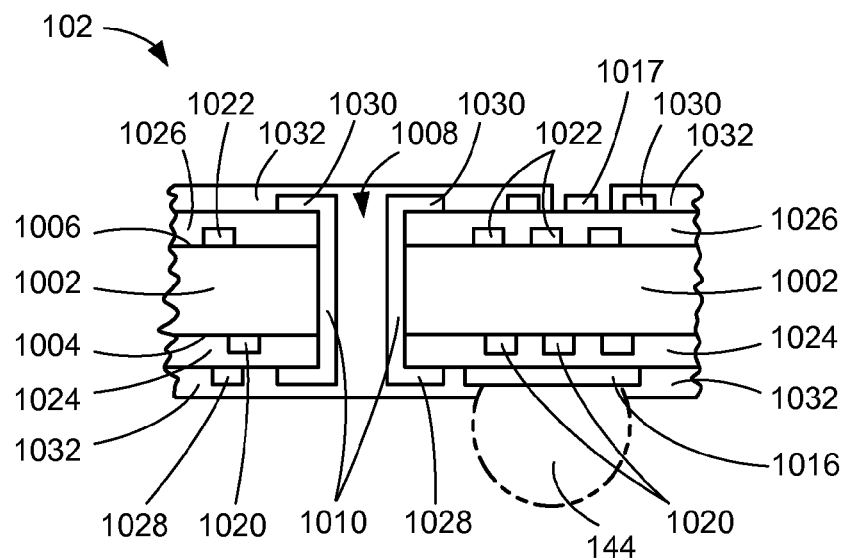
FIG. 10(B) is a second exemplary detailed cross-sectional view of a portion of the base substrate.

Referring now to FIG. 10(B), therein is shown a second exemplary detailed cross-sectional view of a portion of the base substrate 102. The base substrate 102 can be provided by the strip 904 of FIG. 9. For example, the base substrate 102 can represent a four-layer (4L) substrate with plated through holes (PTH).

The base substrate 102 can include the base core layer 1002. The base core layer 1002 can include the base core bottom side 1004 and the base core top side 1006. The base substrate 102 can include a first base bottom conductive layer 1020 and a first base top conductive layer 1022.

The first base bottom conductive layer 1020 and the first base top conductive layer 1022 are defined as electrically conductive structures. The first base bottom conductive layer 1020 and the first base top conductive layer 1022 can be formed with an electrically conductive material including copper (Cu), a metal, or any other conductive material. As a specific example, the first base bottom conductive layer 1020 and the first base top conductive layer 1022 can be formed with copper foils.

The first base bottom conductive layer 1020 and the first base top conductive layer 1022 can be directly on the base core bottom side 1004 and the base core top side 1006, respectively. For example, the first base bottom conductive layer 1020 and the first base top conductive layer 1022 can be patterned to provide a number of conductive traces for routing electrical signals.

The base substrate 102 can include a base bottom insulation layer 1024 and a base top insulation layer 1026 to provide electrical isolation between electrically conductive layers. The base bottom insulation layer 1024 can be directly on the first base bottom conductive layer 1020 and a portion of the base core bottom side 1004. The base top insulation layer 1026 can be directly on the first base top conductive layer 1022 and a portion of the base core top side 1006.

For example, the base bottom insulation layer 1024 and the base top insulation layer 1026 can be formed with an insulation material including a dielectric, epoxy resin, or glass epoxy. For example, the base bottom insulation layer 1024 and the base top insulation layer 1026 can include a prepreg material. As a specific example, the base bottom insulation layer 1024 and the base top insulation layer 1026 can include polytetrafluoroethylene (or Teflon), glass-reinforced epoxy, phenolic cotton paper, woven glass, matte glass, polyester, non-woven glass, or a combination thereof.

The base substrate 102 can include the base hole 1008 through the base core layer 1002 from the base core bottom side 1004 to the base core top side 1006. The base hole 1008 can be through the base bottom insulation layer 1024 and the base top insulation layer 1026.

The base substrate 102 can include the base connector 1010 within the base hole 1008 and directly on sidewalls of the base core layer 1002, the base bottom insulation layer 1024, and the base top insulation layer 1026. The sidewalls horizontally bound the base hole 1008.

The base substrate 102 can include a second base bottom conductive layer 1028 and a second base top conductive layer 1030. The second base bottom conductive layer 1028 and the second base top conductive layer 1030 are defined as electrically conductive structures. The second base bottom conductive layer 1028 and the second base top conductive layer 1030 can be formed with an electrically conductive material including copper (Cu), a metal, or any other conductive material. As a specific example, the second base bottom conductive layer 1028 and the second base top conductive layer 1030 can be formed with copper foils.

The second base bottom conductive layer 1028 and the second base top conductive layer 1030 can be directly on the base bottom insulation layer 1024 and the base top insulation layer 1026, respectively. For example, the second base bottom conductive layer 1028 and the second base top conductive layer 1030 can be patterned to provide a number of conductive traces for routing electrical signals.

The second base bottom conductive layer 1028 and the second base top conductive layer 1030 can be directly on a bottom side of the base connector 1010 and a top side of the base connector 1010, respectively. The base connector 1010 provides electrical connectivity between the second base bottom conductive layer 1028 and the second base top conductive layer 1030.

The first base bottom conductive layer 1020 and the second base bottom conductive layer 1028 can be electrically connected to each other. The first base top conductive layer 1022 and the second base top conductive layer 1030 can be electrically connected to each other.

The base substrate 102 can include the base bottom pad 1016 to provide an attachment site for attaching one of the external connectors 144. One of the external connectors 144 is shown with a dash line since the external connectors 144 are to be attached in a subsequent phase of manufacture.

The base substrate 102 can also include the base top pad 1017 to provide an attachment site for attaching one of the inter-substrate connectors 138 of FIG. 1. For example, the base bottom pad 1016, the base top pad 1017, the second base bottom conductive layer 1028, and the second base top conductive layer 1030 can be plated with an electrically conductive material including copper (Cu), nickel (Ni), palladium (Pd), gold (Au), or any combination thereof.

The base substrate 102 can include a base protection layer 1032, which is defined as an electrically insulation structure. The base protection layer 1032 can be formed with an insulating material including solder resist or epoxy.

The base protection layer 1032 can be directly on the base connector 1010 within the base hole 1008. The base protection layer 1032 can be directly on the second base bottom conductive layer 1028, the second base top conductive layer 1030, a portion of the base bottom pad 1016, and portions of the base bottom insulation layer 1024 and the base top insulation layer 1026.

The base bottom pad 1016 can be partially exposed from the base protection layer 1032. The base top pad 1017 can be exposed from the base protection layer 1032. A portion of the base top insulation layer 1026 at a top side of the base top insulation layer 1026 and surrounding the base top pad 1017 can be exposed from the base protection layer 1032.

Figure 11:
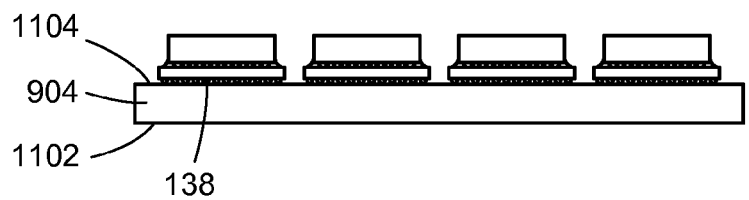
FIG. 11 is the structure of FIG. 8 in a stacking phase.

Referring now to FIG. 11, therein is shown the structure of FIG. 8 in a stacking phase. The structure of FIG. 8 can be mounted over the strip 904. The strip 904 can include a strip bottom side 1102 and a strip top side 1104. The inter-substrate connectors 138 can be attached to the strip top side 1104.

Figure 12:
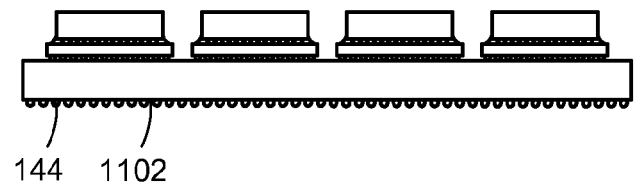
FIG. 12 is the structure of FIG. 11 in a second connector-attachment phase.

Referring now to FIG. 12, therein is shown the structure of FIG. 11 in a second connector-attachment phase. The external connectors 144 can be attached to the strip bottom side 1102.

Figure 13:
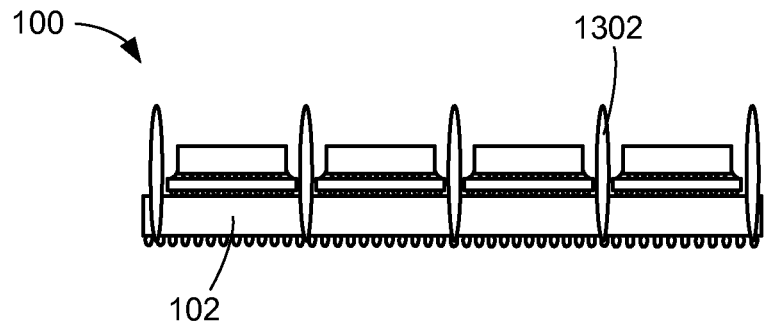
FIG. 13 is the structure of FIG. 12 in a singulation phase.

Referring now to FIG. 13, therein is shown the structure of FIG. 12 in a singulation phase. The integrated circuit packaging system 100 can include a package singulation process to produce individual units of the integrated circuit packaging system 100. After the singulation phase, the base substrate 102 can be formed by singulating the strip 904 of FIG. 9. The package singulation process can include a mechanical or optical process.

For example, the package singulation process can include a mechanical method including sawing. Also for example, the singulation phase can include a mechanical process with a singulation device 1302 including a saw blade for cutting the strip 904.

Figure 14:
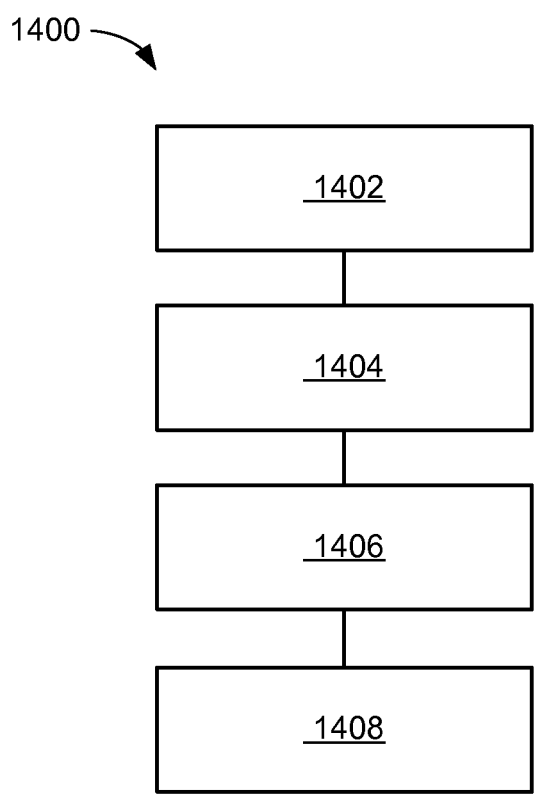
FIG. 14 is a flow chart of a method of manufacture of the integrated circuit packaging system in a further embodiment of the present invention.

Referring now to FIG. 14, therein is shown a flow chart of a method 1400 of manufacture of the integrated circuit packaging system 100 in a further embodiment of the present invention. The method 1400 includes: providing a base substrate in a block 1402; mounting a stack substrate over the base substrate with an inter-substrate connector directly on the stack substrate and the base substrate, the inter-substrate connector having an inter-substrate connector pitch in a block 1404; mounting an integrated circuit over the stack substrate, the integrated circuit having an internal connector directly on the stack substrate in a block 1406; and attaching an external connector directly on the base substrate, the external connector having an external connector pitch greater than the inter-substrate connector pitch in a block 1408.

Thus, it has been discovered that the integrated circuit packaging system of the present invention furnishes important and heretofore unknown and unavailable solutions, capabilities, and functional aspects for an integrated circuit packaging system with substrate. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
a base substrate;
a stack substrate over the base substrate, the stack substrate having a stack core layer having a stack hole through the stack core layer, the stack hole is bounded by a side wall of the stack core layer, a stack connector is within the stack hole of the stack core layer on the side wall of the stack core layer, first stack conductive layers are patterned on the stack core layer and the stack connector, a stack insulation is within the stack hole and the stack connector, the stack insulation is directly on the stack connector, the stack core layer, and the first stack conductive layers, the stack insulation has stack insulation holes exposing portions of the first stack conductive layers, second stack conductive layers and stack pads are patterned on the stack insulation, stack inter-layer connectors directly connect the first stack conductive layers and the second stack conductive layers in the stack insulation holes, stack protection layers fully cover the second stack conductive layers and the stack inter-layer connectors, the stack protection layers cover portions of the stack pads including a stack bottom pad and a stack top pad;
an inter-substrate connector directly on the stack bottom pad of the stack substrate and the base substrate, the inter-substrate connector having an inter-substrate connector pitch;
an integrated circuit over the stack substrate, the integrated circuit having an internal connector directly on the stack top pad of the stack substrate, the internal connector having an internal connector pitch smaller than the inter-substrate connector pitch;
an external connector directly on the base substrate, the external connector having an external connector pitch greater than the inter-substrate connector pitch;
an underfill attached to the integrated circuit and the stack substrate, the underfill covers the internal connector, the underfill is attached to only a stack substrate top side of the stack substrate; and
wherein: the stack substrate includes a stack substrate width less than a base substrate width of the base substrate; and
the integrated circuit includes an integrated circuit width less than the stack substrate width.

2. The system as claimed in claim 1 wherein the external connector includes an external connector height greater than an inter-substrate connector height of the inter-substrate connector.

3. The system as claimed in claim 1 wherein the stack substrate includes a stack substrate width less than a base substrate width of the base substrate.

4. The system as claimed in claim 1 wherein the inter-substrate connector is directly on the stack substrate and the base substrate.

5. The system as claimed in claim 1 wherein the external connector includes external connectors attached to the base substrate in a peripheral array.

6. The system as claimed in claim 1 wherein the external connector includes an external connector height greater than an inter-substrate connector height of the inter-substrate connector and an internal connector height of the inter-substrate connector.

7. The system as claimed in claim 1 wherein:
the stack substrate includes a stack substrate bottom side; and the inter-substrate connector is directly on the stack substrate bottom side and the base substrate, the inter-substrate connector having the inter-substrate connector pitch greater than an internal connector pitch of the internal connector.

8. The system as claimed in claim 1 wherein the external connector includes external connectors attached to the base substrate in a peripheral array, the external connectors separate from each other based on the external connector pitch.

* * * * *